(12) United States Patent
Yang et al.

(10) Patent No.: US 8,149,575 B2
(45) Date of Patent: Apr. 3, 2012

(54) WATERPROOF ELECTRONIC DEVICE

(75) Inventors: Mu-Wen Yang, Taipei Hsien (TW); Chih-Chiang Chang, Taipei Hsien (TW)

(73) Assignee: FIH (Hong Kong) Limited, Kowloon (HK)

(*) Notice: Subject to any disclaimer, the term of this patent is extended or adjusted under 35 U.S.C. 154(b) by 423 days.

(21) Appl. No.: 12/468,139

(22) Filed: May 19, 2009

(65) Prior Publication Data
US 2010/0012472 A1 Jan. 21, 2010

(30) Foreign Application Priority Data
Jul. 21, 2008 (CN) .......................... 2008 1 0302867

(51) Int. Cl.
*G06F 1/16* (2006.01)

(52) U.S. Cl. ................... 361/679.56; 455/349; 345/163

(58) Field of Classification Search .................. 345/157, 345/158, 163; 455/575.4, 550.1, 90.1, 349; 361/679.01, 679.02, 679.55, 679.27, 679.06, 361/679.077, 679.21, 679.22, 679.23, 679.26; 200/302.2
See application file for complete search history.

(56) References Cited

U.S. PATENT DOCUMENTS
| | | | | |
|---|---|---|---|---|
| 5,219,067 A | * | 6/1993 | Lima et al. | 200/302.2 |
| 6,983,130 B2 | * | 1/2006 | Chien et al. | 455/90.3 |
| 2008/0024962 A1 | * | 1/2008 | Wang et al. | 361/679 |

* cited by examiner

*Primary Examiner* — Hung Duong
(74) *Attorney, Agent, or Firm* — Altis Law Group, Inc.

(57) ABSTRACT

A waterproof electronic device includes an upper shell and a lower shell configured for detachably and hermetically assembling with the upper shell. At least one of the upper shell and lower shell comprising a rubber layer disposed thereon to hermetically assemble with each other. The invention further provides a method for making the waterproof electronic device.

13 Claims, 5 Drawing Sheets

WATERPROOF ELECTRONIC DEVICE

TECHNICAL FIELD

The exemplary disclosure generally relates to an electronic device, and particularly to a waterproof electronic device.

DESCRIPTION OF RELATED ART

When an electronic device is used in a wet environment or on rainy days, the inner components thereof are easily affected by dampness that shortens the useful life of the electronic device.

To avoid the electronic device from being damaged under wet environment, the waterproof structures such as airproof bars and rubber gaskets are applied to the electronic device. Since the airproof bars and rubber gaskets need pre-define big space within the electronic device and are hard to position. What's more, the airproof bars and rubber gaskets are easy to be distorted among the positioning that affects the waterproof efficiency of the electronic device badly.

Therefore, there is room for improvement within the art.

BRIEF DESCRIPTION OF THE DRAWINGS

Many aspects of the present waterproof electronic device can be better understood with reference to the following drawings. The components in the drawings are not necessarily drawn to scale, the emphasis instead being placed upon clearly illustrating the principles of the present waterproof electronic device. Moreover, in the drawings, like reference numerals designate corresponding parts throughout the several views.

DETAILED DESCRIPTION

Figure 1:
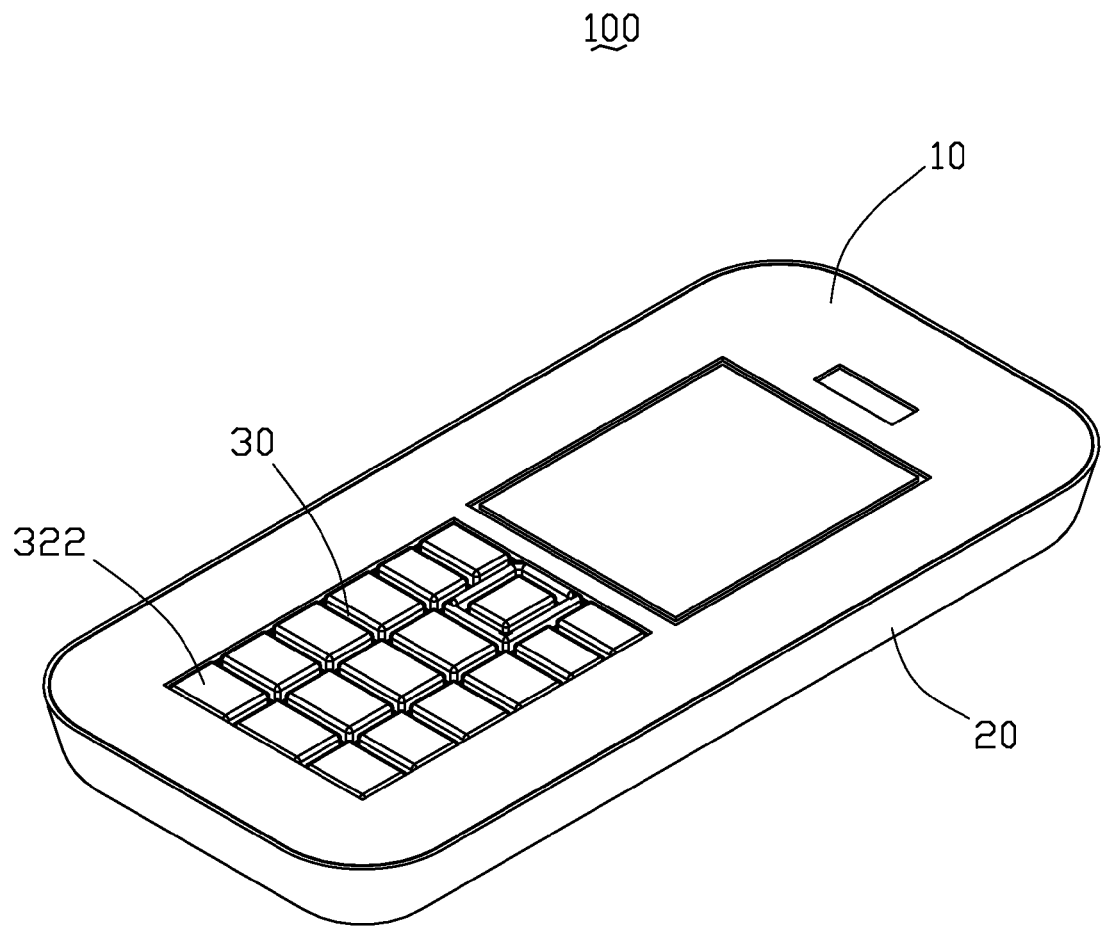
FIG. 1 shows a perspective view of a waterproof electronic device in accordance with an exemplary embodiment of the present invention.
Figure 2:
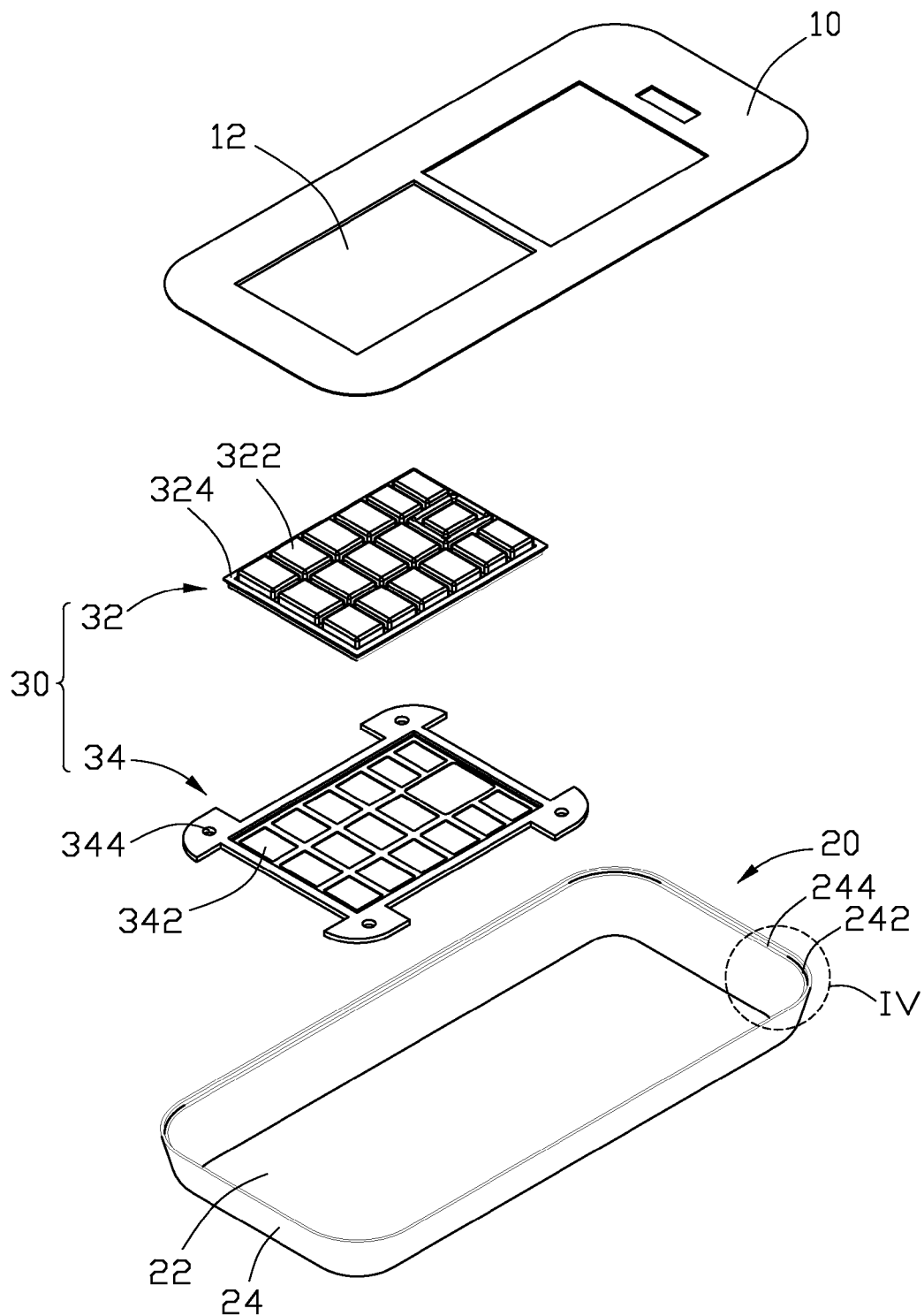
FIG. 2 shows an exploded perspective view of the waterproof electronic device shown in FIG. 1.

Please referring to FIG. 1 and FIG. 2, a waterproof electronic device 100 includes an upper shell 10, a lower shell 20 and a keyboard 30. The upper shell 10 is configured for detachably and hermetically assembling with the lower shell 20.

Figure 3:
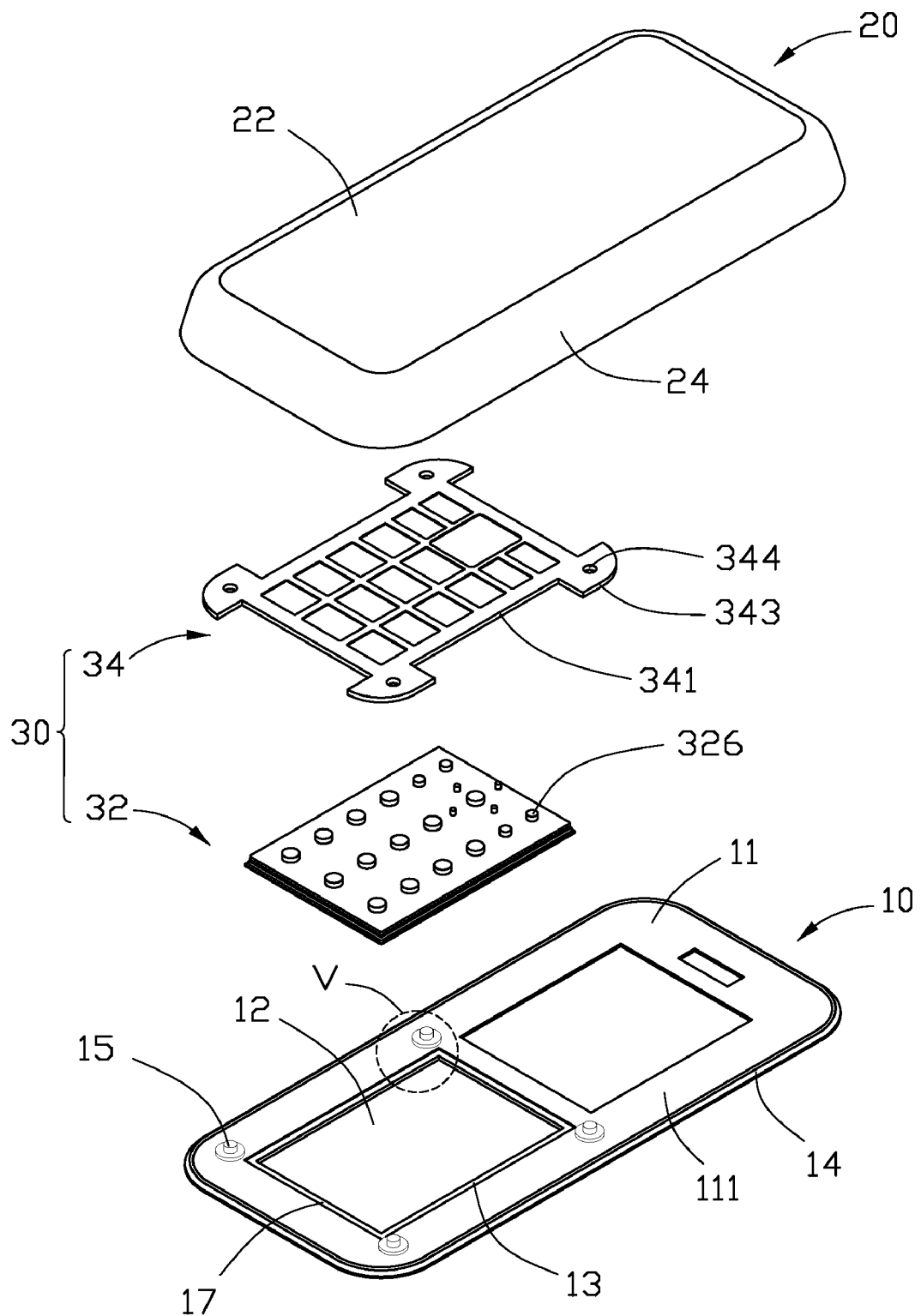
FIG. 3 is similar to FIG. 2, but viewed from another aspect.
Figure 4:
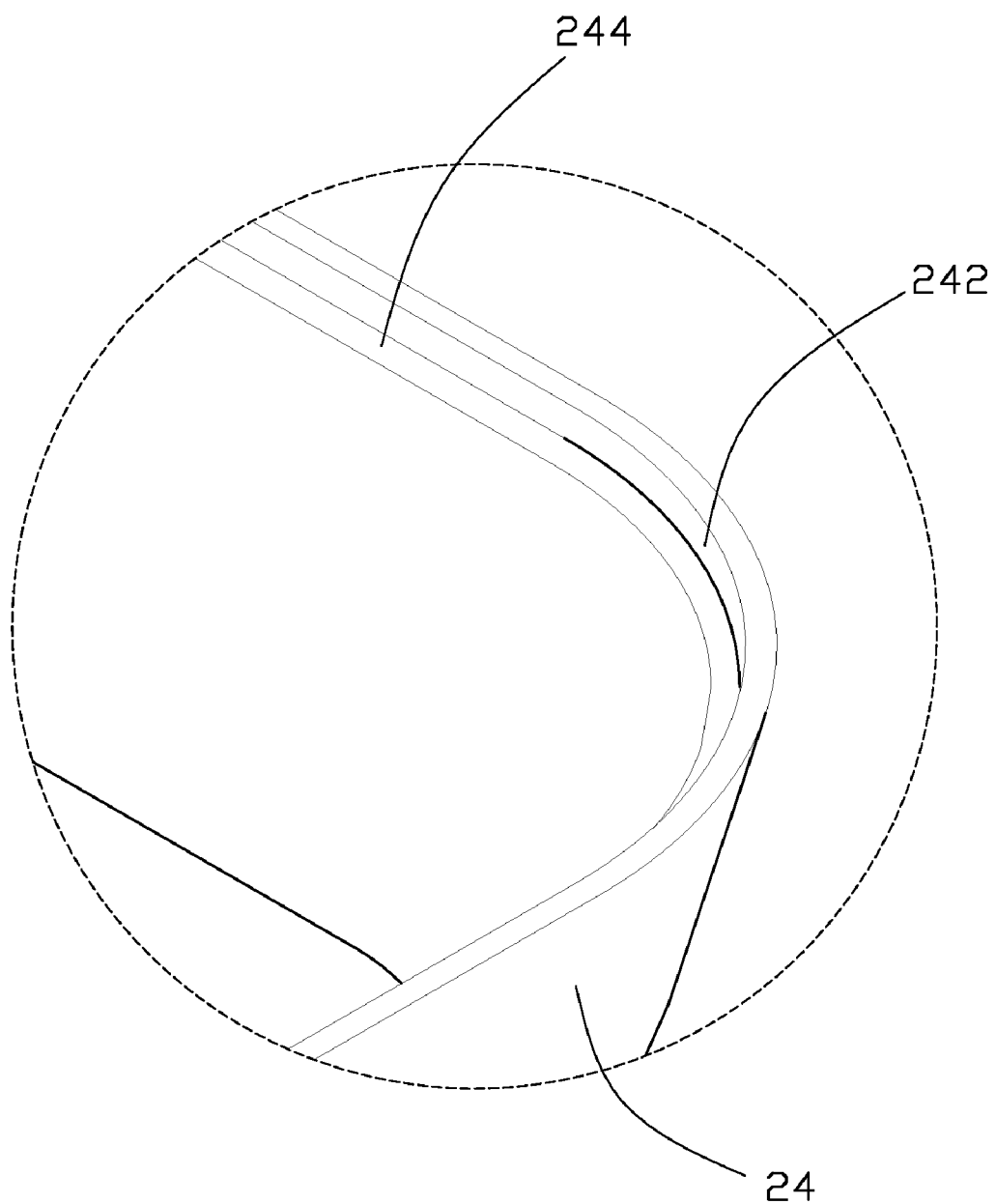
FIG. 4 shows an enlarged view of a circled portion IV of FIG. 2.
Figure 5:
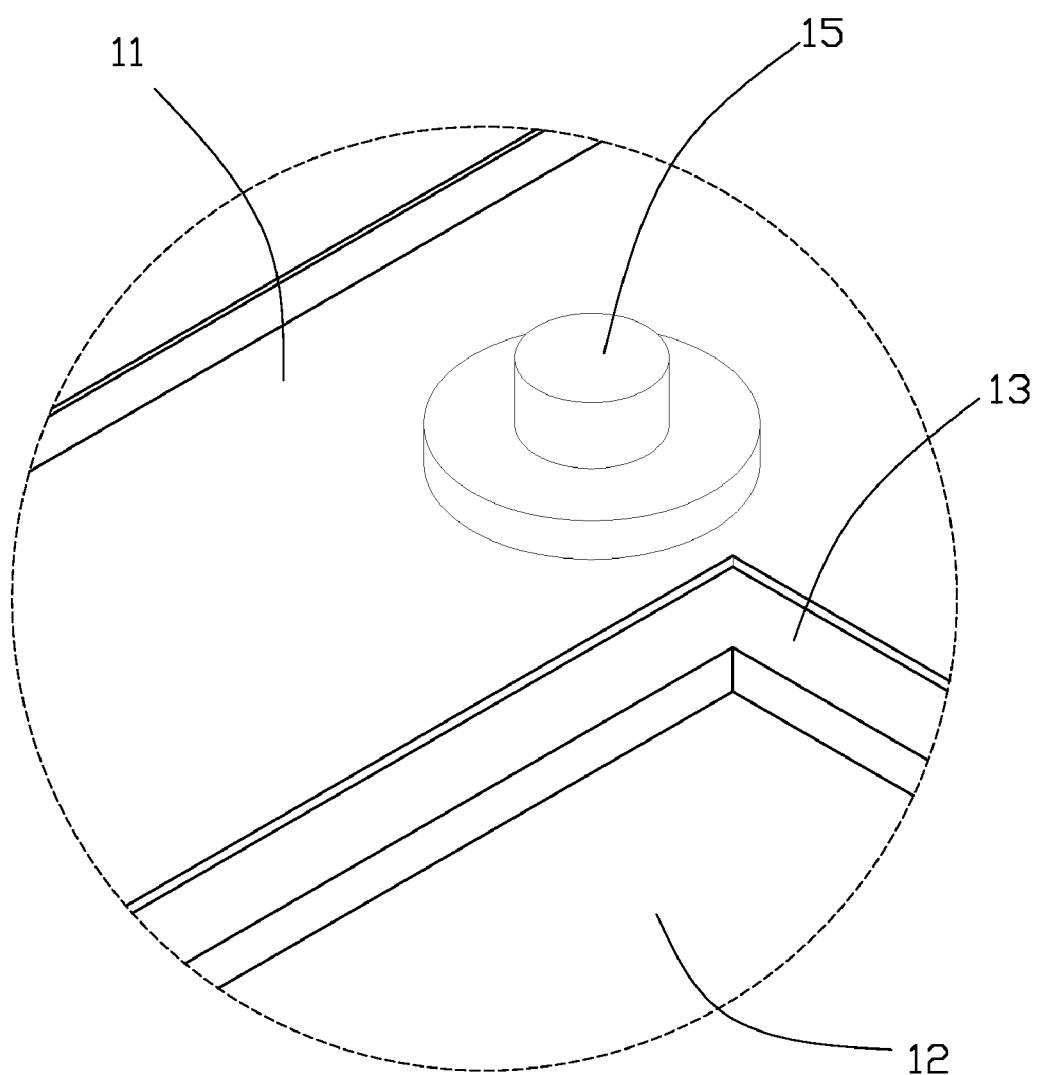
FIG. 5 shows an enlarged view of a circled portion V of FIG. 3.

Also Referring to FIGS. 3 and 4, the upper shell 10 includes a main board 11 with an inner surface 111 facing to the lower shell 20, a keyboard hole 12, a first stepped groove 13, a first flange 14 and four fixing poles 15. The keyboard hole 12 is substantially rectangular and defined through the main board 11 of the upper shell 10 for accommodating and assembling the keyboard 30. The first stepped groove 13 is a substantially rectangular recess from the inner surface 111 of the upper shell 10. The first stepped groove 13 surrounds and communicates with the keyboard hole 12. The bottom of the first stepped groove 13 defines a first rubber layer 17 thereon so as to tightly assemble with the keyboard 30. The first flange 14 is substantially rectangular frame protruding from the edge of the inner surface 111 of the upper shell 10 and configured for hermetically assembling with the lower shell 20. In the present embodiment, the first flange 14 is made of soft and elastic material such as rubber material. The four fixing poles 15 are substantially stepped column shape and disposed on the inner surface 111 of the main board 11 of the upper shell 10 adjacent to the four corners of the first stepped groove 13 respectively, so as to fix the keyboard 30.

Also Referring to FIG. 3, the lower shell 20 includes a base board 22 and a surrounding wall 24 extending from the outer edge of the base board 22. The surrounding wall 24 is substantially rectangular frame shape and perpendicular to the base board 22. As shown in FIGS. 2 and 4, the surrounding wall 24 includes a second stepped groove 242 disposed at the inner side of the extending end thereof corresponding to the first flange 14 of the upper shell 10. The second stepped groove 242 is configured for hermetically assembling with the first flange 14 of the upper shell 10. The bottom of the second stepped groove 242 defines a second rubber layer 244 thereon so as to engage with the first flange 14 of the upper shell 10 tightly.

The keyboard 30 is substantially rectangular board shape and includes a pressing board 32 and an inducing board 34. The pressing board 32 includes a plurality of keys 322 disposed on a surface thereof and thereby the surround edged of the surface forms a second rubber flange 324, so as to hermetically assemble with the first rubber layer 17 of the upper shell 10. The opposite surface of the pressing board 32 forms a plurality of posts 326 protruding therefrom corresponding to the keys 322 respectively. The inducing board 34 includes a substantially rectangular board shaped main body 341 and four positioning blocks 343 disposed at the four corners of the main body 341 respectively. The four positioning blocks 343 extend from the four corners of the main body 341 respectively and parallel to the main body 341. The main body 341 includes a plurality of inducing switches 342 corresponding to the posts 326 of the pressing board 32. Each positioning blocks 343 defines an assembling hole 344 therethrough corresponding to the fixing poles 15 of the upper shell 10.

In assembly, the pressing board 32 is assembled within the keyboard hole 12 of the upper shell 10, with the keys 322 exposing from the keyboard hole 12. The second rubber flange 324 of the pressing board 32 tightly latches or contacts with first rubber layer 17 disposed at the bottom of the first stepped groove 13, to ensure the hermetic contact with each other. The inducing board 34 is fixed to the upper shell 10. The four positioning blocks 343 of the inducing board 34 are fixed to the four fixing poles 15 of the upper shell 10 respectively, with the assembling hole 344 thereof engaging with the corresponding fixing pole 15. The pressing board 32 is sandwich between the inducing board 34 and the upper shell 10. The posts 326 of the pressing board 32 contact with the inducing switches 342 of the inducing board 34 respectively. Assemble the lower shell 20 with the upper shell 10, the first flange 14 of the upper shell 10 latches with the corresponding second stepped groove 242 of the lower shell 20 and tightly contact with the second rubber layer 244 disposed on the bottom of the second stepped groove 242, to ensure the hermetical contact therebetween.

A method for making the waterproof electronic device may include the following steps:

Firstly, the upper shell 10 is manufactured by double-shot mold. The main board 11 of the upper shell 10 is formed by injection molding plastic material firstly. The first flange 14 and the first rubber layer 17 are formed by injection molding to ensure that the main board 11 and the first flange 14 formed within one mold.

Secondly, the lower shell 20 is manufactured by double-shot mold. The base board 22 and the surrounding wall 24 are formed by injection molding plastic material firstly, with the second stepped groove 242 formed at the inner side of the surrounding wall. The second rubber layer 244 is formed by injection molding within one mold.

Thirdly, a keyboard 30 is provided and assembled to topper shell 10 and assemble the lower shell 20 with the upper shell 10.

It is understood that either the topper shell 10 with the first flange 14 or the lower shell 20 with the second rubber layer 244 may also achieve the airproof and hermetical efficiency.

It is to be understood, however, that even though numerous characteristics and advantages of the present invention have been set forth in the foregoing description, with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A waterproof electronic device comprising:
   an upper shell comprising a first flange protruding from the edge of the inner surface thereof; and
   a lower shell configured for detachably and hermetically assembling with the upper shell, the lower shell comprising a stepped groove corresponding to the first flange of the upper shell;
   wherein the bottom of the stepped groove includes a rubber layer defined thereon.

2. The waterproof electronic device as claimed in claim 1, wherein the lower shell includes a base board and a surrounding wall extending from the outer edge of the base board; the surrounding wall defines the stepped groove disposed at an inner side of an extending end thereof.

3. The waterproof electronic device as claimed in claim 1, wherein the first flange is made of soft and elastic material.

4. The waterproof electronic device as claimed in claim 1, wherein the upper shell further includes a keyboard hole defined there through; the waterproof electronic device further includes a keyboard being hermetically accommodated and assembled within the keyboard hole.

5. The waterproof electronic device as claimed in claim 4, wherein the upper shell further includes a substantially ring shape first stepped groove recessed from the inner surface thereof, the first stepped groove surrounds and communicates with the keyboard hole, the keyboard being tightly and hermetically assembled within the keyboard hole.

6. The waterproof electronic device as claimed in claim 5, wherein the keyboard includes a pressing board with a plurality of keys disposed on a surface thereof, the surround edged of the pressing board forms a rubber flange corresponding to the rubber layer of the upper shell for hermetically assemble with each other.

7. The waterproof electronic device as claimed in claim 6, wherein the opposite surface of the pressing board includes a plurality of posts protruding therefrom corresponding to the keys respectively; the keyboard further includes an inducing board fixed to the upper shell, the inducing board includes a plurality of inducing switches disposed thereon corresponding to the posts of the pressing board, the pressing board is sandwiched between the inducing board and the upper shell.

8. The waterproof electronic device as claimed in claim 6, wherein the inducing board includes a main body and four positioning blocks disposed at the four corners of the main body respectively, the four positioning blocks extend from the four corners of the main body respectively and are parallel to the main body, each positioning block defines an assembling hole therethrough, the upper shell further includes four fixing poles disposed on the inner surface thereof adjacent to the four corners of the stepped groove corresponding to assembling holes of the inducing board respectively, to fix the keyboard to the upper shell.

9. The waterproof electronic device as claimed in claim 5, wherein the bottom of the first stepped groove includes a first rubber layer defined thereon.

10. A waterproof electronic device comprising:
    an upper shell with a keyboard hole defined there through, the upper shell comprising a substantially ring shape first stepped groove recessed from an inner surface thereof, the first stepped groove surrounding and communicating with the keyboard hole;
    a lower shell configured for detachably and hermetically assembling with the upper shell; and
    a keyboard being hermetically accommodated and assembled within the keyboard hole;
    wherein at least one of the upper shell and lower shell comprising a rubber layer disposed thereon to hermetically assemble with each other.

11. The waterproof electronic device as claimed in claim 10, wherein the lower shell comprising a base board and a surrounding wall extending from the outer edge of the base board; the surrounding wall comprises a stepped groove disposed at an inner side of an extending end thereof to tightly latch with the upper shell.

12. The waterproof electronic device as claimed in claim 11, wherein the upper shell is substantially rectangular board shape and includes a first flange protruding from the edge of the inner surface thereof for hermetically assembling with the lower shell.

13. The waterproof electronic device as claimed in claim 10, wherein the upper shell and lower shell are manufactured with double-shot mold.

* * * * *